(12) United States Patent
Van Horck

(10) Patent No.: US 7,697,077 B2
(45) Date of Patent: Apr. 13, 2010

(54) CHANNEL NUMBER SORTING FOR DIGITAL TELEVISION

(75) Inventor: Hendrikus G. Van Horck, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1102 days.

(21) Appl. No.: 10/567,392

(22) PCT Filed: Aug. 4, 2004

(86) PCT No.: PCT/IB2004/051475

§ 371 (c)(1),
(2), (4) Date: Feb. 7, 2006

(87) PCT Pub. No.: WO2005/015900

PCT Pub. Date: Feb. 17, 2005

(65) Prior Publication Data

US 2006/0230429 A1    Oct. 12, 2006

Related U.S. Application Data

(60) Provisional application No. 60/493,271, filed on Aug. 7, 2003, provisional application No. 60/529,583, filed on Dec. 15, 2003.

(51) Int. Cl.
*H04N 5/50* (2006.01)

(52) U.S. Cl. .................. 348/731; 348/468; 348/461; 348/473; 348/725; 725/38

(58) Field of Classification Search ......... 348/725–734, 348/570, 385–387.1, 468, 461, 473, 478, 348/553–555; 725/38, 100, 117, 135, 139–140, 725/151–152; *H04N 5/50*
See application file for complete search history.

(56) References Cited

U.S. PATENT DOCUMENTS

| | | | |
|---|---|---|---|
| 4,527,194 A | 7/1985 | Sirazi | |
| 5,315,392 A * | 5/1994 | Ishikawa et al. | 725/56 |
| 5,600,378 A | 2/1997 | Wasilewski | |
| 5,844,633 A * | 12/1998 | Kim | 725/56 |
| 6,003,041 A | 12/1999 | Wugofski | |

FOREIGN PATENT DOCUMENTS

| | | |
|---|---|---|
| GB | 2384924 A | 8/2003 |
| WO | WO0128093 A1 | 4/2001 |

* cited by examiner

Primary Examiner—Trang U Tran

(57) ABSTRACT

Channel numbers are provided for a digital television receiver (200) that receives multiple transmissions (100, 110, 120), such as from different regions of a country or from different countries. The channel numbers for the home country transmission are assigned based on logical channel number (LCN) data in the transmission. The channel numbers for the transmissions of the other countries are provided so that they are in a higher range than the channel numbers for the home country transmission. For different regional transmissions, the channel numbers for the transmission with the strongest service, e.g., based on quality/bit error rate, signal strength, and/or frequency, may be arranged before the channel numbers for the lower strength transmissions.

20 Claims, 1 Drawing Sheet

CHANNEL NUMBER SORTING FOR DIGITAL TELEVISION

CROSS REFERENCE TO RELATED APPLICATION

Figure 1:
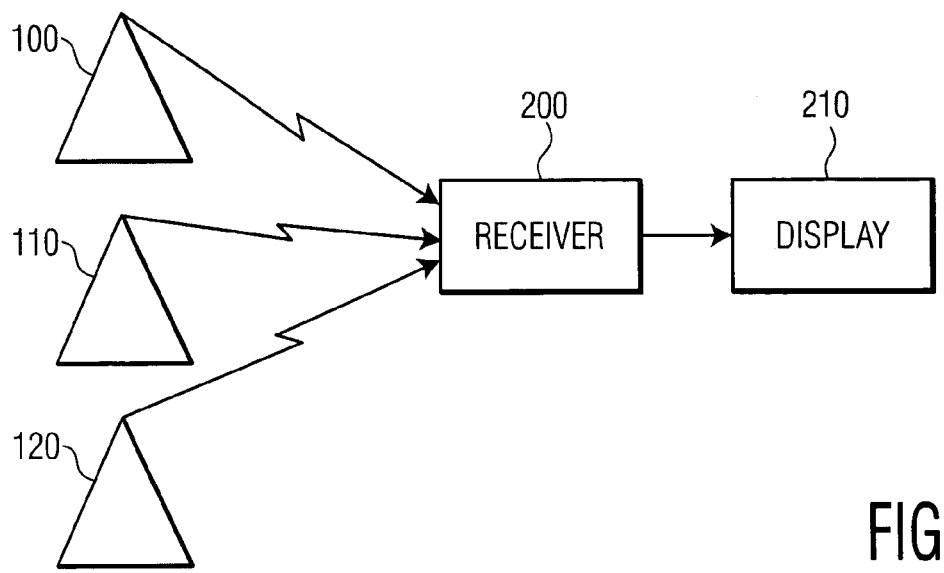

This application claims the benefit of U.S. provisional application Ser. No. 60/493,271 and 60/529,583 filed Aug. 7, 2003 and Dec. 15, 2003, which is incorporated herein in whole by reference.

The invention relates generally to digital television communications and, more particularly, to a technique for organizing channel numbers.

Digital television communications have become increasingly popular due to the quality of the audio and video signals and the various features that can be realized. For example, standards defined by the Digital Video Broadcasting (DVB) consortium have been implemented in many parts of the world. Among other things, these standards include a series of transmission specifications, including DVB-S, a satellite transmission standard, DVB-C, a cable delivery standard, and DVB-T, a terrestrial transmission standard. DVB-T is a sophisticated and flexible digital terrestrial transmission system that is based on COFDM (Coded Orthogonal Frequency Divisional Multiplexing) and QPSK, 16 QAM and 64 QAM modulation. DVB-T allows services providers to match, and even improve on, analogue coverage, at a fraction of the power. Moreover, it extends the scope of digital terrestrial television in the mobile field, such as to portable hand-held devices.

Digital television transmissions include logical channel number (LCN) data for the different channels of programs in the transmission. The programs are mapped to a channel number based on the LCN data to enable the user to locate desired programs on his or her television or other receiving device. For example, for DVB-T receivers, the LCN has been constructed to facilitate automatic preset assignment. Techniques for dealing with the assigned presets differ between all the major standards. Moreover, a problem arises in that a receiver can receive multiple transmission that have conflicting LCN data For example, for Europe there is the problem that one can receive (at least in the border areas) DVB-T content from different countries, or different regions of the same country. Different transmissions can have conflicting LCNs, or a transmission may not have LCNs associated with it.

Accordingly, it would be desirable to provide a method and apparatus for providing and organizing channel numbers that addresses the above and other issues. A sorting algorithm that benefits the end-user most has been devised. The sorting algorithm provides a convenient listing of the services in a logical order.

Namely, the transmission of the country that the receiver is in, as set by the user, is given its channel numbers based on its LCN data. In the case of duplicate services, only the strongest service is stored. If there are duplicates with regional content, they are both stored but the weaker service is stored in the higher channel number range. Services from other countries are inserted at the end, alphabetically sorted and grouped per country, based on the original network ID. A list of services is then available. A gap in the list may occur between services whose preset or other channel number is allocated based on LCN data, and services whose preset or other channel number is not allocated based on LCN data.

For example, the strongest service may be the one with the highest quality as measured by BERQ (Bit Error Rate Quality). If two or more transmissions have the same highest quality, other factors can be examined as tie-breakers, such as signal strength, so that among the transmissions with the same highest quality, the transmission with the higher signal strength is selected. If two or more transmissions have the same highest quality and the same highest signal strength, other factors can be examined as tie-breakers, such as transmission frequency, so that among the transmissions with the same highest quality and signal strength, the transmission with the higher frequency is selected to use its original LCNs.

In a particular aspect of the invention, a method for providing channel numbers includes receiving at least one domestic digital data transmission and at least one foreign digital data transmission; wherein the at least one domestic digital data transmission and the at least one foreign digital data transmission include logical channel number data for channels of programs therein; assigning channel numbers for the channels of programs in the at least one domestic digital data transmission, according to the logical channel number data therein; and assigning channel numbers for the channels of programs in the at least one foreign digital data transmission that are in a higher range than the channel numbers for the channels of programs in the at least one domestic digital data transmission.

In a further aspect of the invention, a method for providing channel numbers includes receiving a plurality of domestic digital data transmissions of digital data services with different regional content; wherein the plurality of domestic digital data transmissions include logical channel number data for channels of programs therein; determining a particular one of the plurality of domestic digital data transmissions that has the strongest service; assigning channel numbers for the channels of programs in the particular one of the domestic digital data transmissions that has the strongest service, according to the logical channel number data therein; and assigning channel numbers, for the channels of programs in the plurality of domestic digital data transmissions other than the particular one of the domestic digital data transmissions that has the strongest service, that are grouped in at least one group, and that are in a higher range than the channel numbers for identifying the channels of programs in the particular one of the domestic digital data transmissions that has the strongest service.

Related receivers and program storage devices are also provided.

Figure 2:
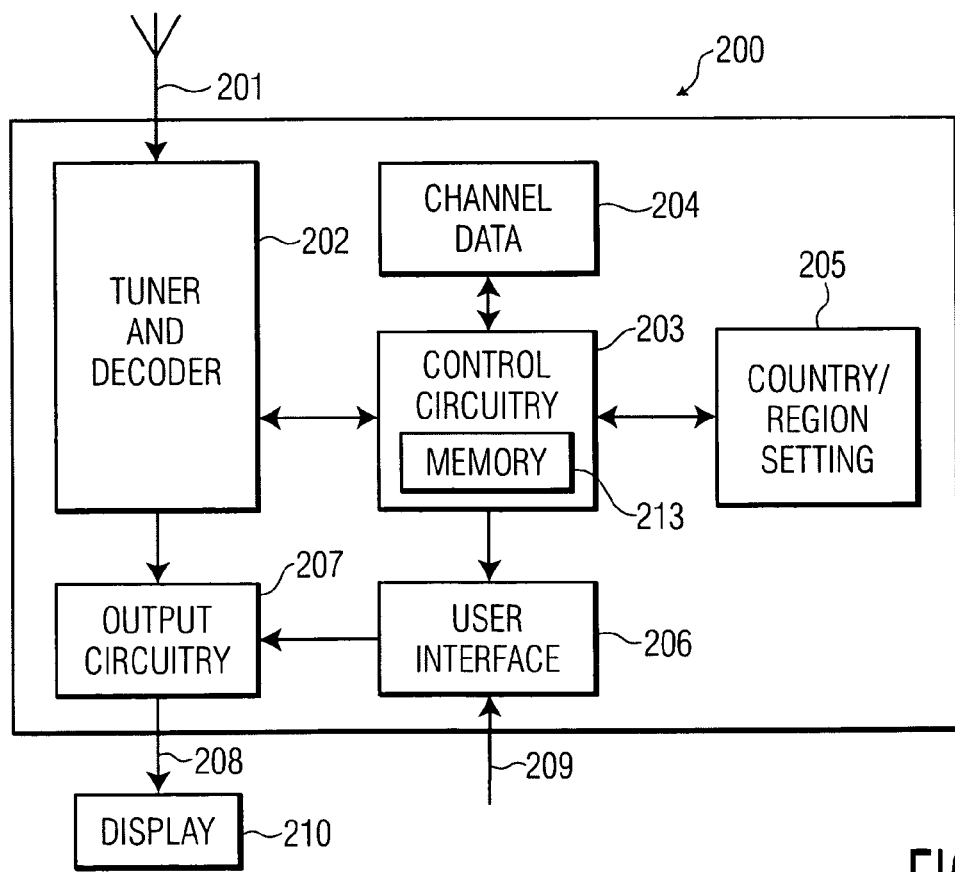

In the drawings:

FIG. 1 illustrates the transmission of multiple digital data transmissions to a receiver; and FIG. 2 illustrates an example receiver for assigning channel numbers according to the invention.

In all the Figures, corresponding parts are referenced by the same reference numerals.

FIG. 1 illustrates the transmission of multiple digital data transmissions from respective transmitters 100, 110 and 120 to an example receiver 200. Block 200 is a "receiver", and block 210 is a "display." The different transmissions may be from different countries, regions or other jurisdictions. Three transmissions are shown as an example only. For example, a first transmission may be a domestic transmission that is associated with the same country in which the receiver 200 is located. The user may provide a country and/or region setting for the receiver, which does not necessarily have to correspond with the actual location of the receiver, but normally would correspond. The second and third transmissions may be associated with foreign countries. In another possible scenario, the three transmissions are associated with different regions of the same country. Moreover, transmissions from different regions and different countries may also be received at the same receiver.

The receiver 200 may be essentially any suitable data receiver, including Digital Home Equipment, e.g., a digital TV, an interactive digital TV (iDTV) set-top box (STB), personal video recorder (PVR), Digital Audio, or DVD. The receiver may further include a mobile receiver such as a PDA or mobile phone. In accordance with the invention, channel numbers are assigned to one of the transmissions according to its logical channel number (LCN) data, while preset or other channel numbers are assigned to channels of programs in the remaining transmissions in a higher channel number range, such as at the end of the channel number range. For example, the preset or other channel numbers for the transmission that is associated with the same country or region in which the receiver 200 is located may be assigned based on the transmission's LCNs, while preset or other channel numbers are assigned for the transmissions of other countries or regions regardless of the transmissions' LCNs. Typically, the user probably wants the channel numbers to be based on the LCN as used in his/her country or region to be the effective one. In the DVB system, the LCN is denoted by the term logic_channel_number, and is a multi-bit field that indicates the broadcaster's preference for ordering services. However, the invention is suitable for use with other digital data transmission schemes.

Moreover, note that there is a difference in how channels are handled in the U.S. compared to Europe/Australia. In the U.S., the actual broadcast channel/frequency often also is the name of the station, while in Europe this is not the case. In other words, in the U.S. a TV usually directly switches to a channel, while in Europe there is a switch to a preset. For example, in the U.S., channel six will broadcast at a channel 6 frequency, while in Europe SBS6 will be on preset 6, but can be broadcasting at any frequency, e.g., channel 21 frequency. In any case, the invention provides a channel number for each channel of programming.

In one aspect of the invention, all received services are sorted in a particular order. First, all transmissions from the country the receiver is in (based on the user setting) are assigned preset or other channel numbers based on their LCN data. In case of duplicate services, two situations occur:

1. Same digital data service, identical, but from different transmitters. In this case, only the strongest service is stored. The strongest service can be the one with the highest quality, such as the highest BERQ, signal strength and/or frequency.

2. Same service, with regional content (services with regional content, that most of the time broadcast the same content). That is, a station may transmit regional content during specific times. For example, a channel could carry regional, e.g., city-wide, news following a global news program. In this case, the preset or other channel numbers are provided for the strongest service based on the LCN data as transmitted, and the preset or other channel numbers for the other service are stored in the high range. The decision on which service is the strongest may be made based on various factors. For example, the strongest service may be the one with the highest quality as measured by BERQ (Bit Error Rate Quality). BERQ may range, e.g., from 1-255, with a higher number denoting better quality, as discussed further below. As mentioned above, if two or more transmissions have the same highest quality, signal strength and then transmission frequency can be used as tie-breaking factors to determine the preset or other channel number assignments for a service. A higher frequency should be favored since the higher the frequency, the less chance of interference.

Services originating from another country (based on ON Id, or original_network_id, Original Network Identification) are inserted at the end, at the numerically higher channel numbers, alphabetically sorted and grouped per country. Domestic services without an LCN are inserted at the end, as indicated by ON1 rest, domestic (Table 1), before the services originating from another country. The end result will be a list of services as indicated. The channels with the channel numbers in the high range may be alphabetically sorted based on a text identifier associated with each channel, such as the call letters, e.g., ABC, CNN, MTV, NBC. Alphabetical sorting is just one example. Any sorting method could be used. For example, sorting based on the foreign LCNs may be used so that the stations appear in the same order that was intended for the foreign transmission.

In Table 1, ON1 rest, ON2 and ON3 form a continuous block of assigned channel numbers, and the channel numbers are filled starting at the end of the available range (in this case, counting back from channel 999). In this case, it is assumed that presets 1 . . . 999 are available. So, for foreign services we start at 999 and go back, to reach the ordering shown in Table 1. This means that usually the lowest presets are assigned according to the LCN numbers, then we see a gap, then the rest of the domestic channels with an assigned preset are followed by the foreign channels in a higher range of channels. Starting at preset ON1 rest, the presets are all used.

TABLE 1

| | |
|---|---|
| ON1 based on LCNs for domestic transmission (gap) | channels 1-30 |
| ON1 rest, domestic | channels 910-940 |
| ON2, foreign 1 | channels 940-950 |
| ON3, foreign 2 | channels 950-999 |

ON1 is the Original Network Id from the selected country, and ON2 and ON3 represent two different foreign countries. In most cases, there will be a gap between stations for which the preset channel numbers are based on the LCN data, and stations where this is not the case.

When multiple regional transmissions are received, the LCNs of the strongest transmission are used to assign the preset channel numbers, while higher-range preset channel numbers are assigned to the channels of the other regional transmissions regardless of their. LCN data. Preset channel numbers for the foreign transmissions may follow those of the regional transmissions in a higher range of channels. As before, the channels with the higher-range preset channel numbers may be alphabetically sorted based on a text identifier associated with each channel, or based on any other sorting technique.

The following describes a sorting mechanism for use by a receiver.

Sorting may be done based on:

1. Type of service. See Table 2. This is an example only since the table will be changed for every product, e.g., receivers in the UK market will list radio services both in the TV and radio preset list.

2. Strength. See Table 3.

3. Original Network Id. Based on the country-setting, the ON Id for this country is sorted first.

4. LCN: place the service on the requested LCN if possible, otherwise move to a location with the "rest" of the stations. If the station does not have LCNs, it is moved to a location with the "rest" of the stations.

5. Rest: place the services on the list, starting at the end. The services may be sorted using any desired technique.

TABLE 2 service type selection

| Service_type | Description | Destination, List |
|---|---|---|
| 0x00 | Reserved for future use | — |
| 0x01 | Digital television service | TV |
| 0x02 | Digital radio sound service | radio |
| 0x03 | Teletext service | other |
| 0x04 | NVOD reference service | TV |
| 0x05 | NVOD time-shifted service | — |
| 0x06 | Mosaic service | — |
| 0x07 | PAL coded signal | — |
| 0x08 | SECAM coded signal | — |
| 0x09 | D/D2-MAC | — |
| 0x0A | FM Radio | — |
| 0x0B | NTSC coded signal | — |
| 0x0C | data broadcast service | other (MHEG) |
| 0x0D | Reserved for Common Interface Usage | — |
| 0x0E | RCS Map (see EN 301 790) | — |
| 0x0F | RCS FLS (see EN 301 790) | — |
| 0x10 | DVB MHP service | other |
| 0x0D to 0x7F | Reserved for future use | — |
| 0x80 to 0xFE | user defined | — |
| 0xFF | reserved for future use | — |

Note that, in one implementation, two lists are provided, one for TV and one for RADIO. The "other" list can be added subsequently. According to the FRS only the TV and RADIO lists have four favorite lists each. Also, system-defined lists can be added. The data broadcast service (service_type 0x0C) has also been added. A stream with just Multimedia and Hypermedia information coding Expert Group (MHEG) content may use this type.

All services found should remain in the list, except for:
(a) exact doubles. The one with the strongest service, e.g., highest BERQ, will stay in the list, while the other(s) is(are) discarded; and
(b) Services with a service strength, e.g., BERQ, below a threshold level will be discarded (see Table 3, only initial values).

TABLE 3

| Service list: | Threshold level: |
|---|---|
| TV | 80 |
| Radio | 70 |
| Other | 80 |

Regional services with the same LCN shall stay in the list. Only one service can be assigned preset channel numbers based on its original LCN data. The system should decide which service to put at the correct preset channel numbers based on which has the strongest service. The strongest service is assigned the correct preset channel numbers, e.g., based on its LCN data. The other service is moved to the end of the list (see "ON1 rest" in Table 1).

If services are assigned a high preset channel numbers, which means there is no gap between the LCN based block, and the ON rest block, it is sorted in the ON rest section and the LCN is discarded. Graphically, this should end up in a service list looking like the system defined preset-list of Table 1 if three ON id's are identified, where ON 1 is the ON_ID for the current country.

Through the remote control, the user sees all ON 1 services first, which adhere to the designated LCN as much as possible. Then, services from other ONs are grouped together, in alphabetical or other order per ON.

Determination of Transmission Signal Strength

The following provides a quick way to estimate bitstream quality, e.g., BERQ. This information is derived from BER at the Reed-Solomon decoder input in the receiver. It is the negative logarithm in base 10 of BER multiplied by 32.

$$BERQ = -32 * LOG_{10}(BER)$$

BERQ range is 1 . . . 255. It saturates to 255 even if BER is better than $10^{-8}$. If this information is not computed, its value is always zero. Usually, one can consider that values from 1 to roughly 80 to 90 correspond to a totally corrupted signal, values up to 110 to 120 correspond to a partially corrupted signal, and values above 130 correspond to an error free signal. Table 4 provides a correspondence between BER and BERQ (tDEMOD_BERQ).

TABLE 4

| BER | tDEMOD_BERQ |
|---|---|
| 0 . . . 1.075*$10^{-8}$ | 255 |
| 1.075*$10^{-8}$ . . . 1.155·$10^{-8}$ | 254 |
| . . . . . . | |
| 0.86 . . . 0.93 | 2 |
| 0.93 . . . 1 or unlock | 1 |
| unimplemented | 0 |

FIG. 2 illustrates an example receiver for assigning channel numbers according to the invention. Block 202 is a "tuner and decoder." Block 203 is "control circuitry." Block 213 is a "memory". Block 204 is a "channel data" memory. Block 205 is a "country/region setting" memory. Block 207 is "output circuitry". Block 206 is a "user interface." Block 210 is a "display".

In one possible approach, the invention is implemented using components within a television set-top box receiver, e.g., receiver 200 that receives a television signal via an input path 201, such as an antenna, and outputs a signal for display on a display device 210 such as a television via signal output path 208. However, the invention is generally applicable to any type of device that receives video and/or audio programs, or a data-only service that does not require audio or video. For example, the invention may be implemented in a computer that receives video programs from a network such as the Internet, e.g., by downloading, streaming or broadcasting, such as webcasting. The video programs typically include an audio track although this is not required. Moreover, the invention can be used with audio-only programs such as those provided via the Internet, e.g., as webcasts, or via radio broadcasts, including terrestrial and satellite radio broadcasts.

The receiver 200 tunes, demultiplexes and decodes the received programs at a tuner/decoder 200. The programs may be provided in a digital or analog multiplex that is transmitted by cable, satellite, or terrestrial broadcast, for example. Generally, one of the programs is decoded based on a channel selection made by the user/viewer via a handheld remote control. A user input signal from the remote control is processed by a user interface function 206 in the receiver 200. The remote control may use any type of communication path 209, such as infrared, wired, ultrasound, radio frequency, etc.

The decoded program may be communicated to the display device 210 via output circuitry 207 or stored locally for subsequent display. Control circuitry 203, such as a microprocessor with a working memory 213, may interact with the tuner/decoder 202 to control the functions of the tuner/decoder 202. The working memory 213 may be considered a program storage device that stores software that is executed by the control circuitry 203 to achieve the functionality described herein. However, resources for storing and processing instructions such as software to achieve the desired functionality may be provided using any known techniques.

As discussed, preset or other channel numbers may be assigned based on the LCN data carried in the received transmission, or without regard to the LCN data. The received transmission, including its LCN data, is decoded and recovered by the tuner/decoder 202 and provided to the control circuitry 203. The control circuitry 203 determines whether the original LCN data will be used. The original LCN data may be stored in a channel data memory 204. The channel numbers may also be stored in the channel data memory 204. For a particular one of the received transmissions, the control circuitry 203 assigns channel numbers based on the LCN data for the transmission. For the remaining transmission, the control circuitry 203 assigns channel numbers in a higher range, as discussed previously. A country and region setting may be stored in a memory 205 for use by the control circuitry 203 in its decision-making processes. The memories 204 and 205 are shown as being separate but may be combined with other memory resources.

When the user selects a channel via the user interface 206, the control circuitry 203 determines the corresponding program, e.g., by retrieving the channel data from the memory 204. Information associated with the matching channel, such as packet identifiers (PIDs), is used to retrieve the associated program data from the received transmission. The program data can be stored and/or displayed, for example.

While there has been shown and described what are considered to be preferred embodiments of the invention, it will, of course, be understood that various modifications and changes in form or detail could readily be made without departing from the spirit of the invention. It is therefore intended that the invention not be limited to the exact forms described and illustrated, but should be construed to cover all modifications that may fall within the scope of the appended claims.

What is claimed is:

1. A method for providing channel numbers to channels of programs in multiple digital data transmissions received via a digital transmissions receiver, comprising:
  receiving at least one domestic digital data transmission and at least one foreign digital data transmission via the receiver, wherein the at least one domestic digital data transmission and the at least one foreign digital data transmission include logical channel number data for channels of programs therein;
  assigning, via the receiver, channel numbers for the channels of programs in the at least one domestic digital data transmission according to the logical channel number data therein at a lower range of an available range of channel numbers of the receiver; and
  assigning, via the receiver, channel numbers for the channels of programs in the at least one foreign digital data transmission that are in a higher range of the available range than the channel numbers for the channels of programs in the at least one domestic digital data transmission, wherein the channel numbers in the higher range are assigned starting at the end of the available range and counting back towards the lower range.

2. The method of claim 1, wherein:
  the receiving at least one domestic digital data transmission comprises receiving a plurality of domestic digital data transmissions of the same digital data service from different transmitters, and the plurality of domestic digital data transmissions include logical channel number data for channels of programs therein; and
  the assigning channel numbers for the channels of programs in the at least one domestic digital data transmission comprises assigning channel numbers according to the logical channel number data included in a particular one of the plurality of domestic digital data transmissions that has a strongest service, among the plurality of domestic digital data transmissions, for the channels of programs therein.

3. The method of claim 2, wherein:
  the particular one of the plurality of domestic digital data transmissions has the strongest service when its quality alone is highest among the plurality of domestic digital data transmissions; and
  the particular one of the domestic digital data transmissions has the strongest service when its signal strength alone is highest among at least two of the plurality of domestic digital data transmissions that have the same highest quality.

4. The method of claim 2, wherein:
  the particular one of the plurality of domestic digital data transmissions has the strongest service when its frequency is highest among at least two of the plurality of domestic digital data transmissions that have the same highest quality and the same highest signal strength.

5. The method of claim 2, wherein:
  the channel numbers for the channels of programs in the plurality of domestic digital data transmissions other than the particular one of the domestic digital data transmissions that has the strongest service are grouped in at least one group, and are assigned in a higher range of the available range than the channel numbers for the channels of programs in the particular one of the domestic digital data transmissions that has the strongest service, at the end of the available range, before the channel numbers of the channels of programs in the at least one foreign digital data transmission.

6. The method of claim 2, wherein:
  the channel numbers for the channels of programs in the plurality of domestic digital data transmissions other than the particular one of the domestic digital data transmissions that has the strongest service are grouped in a plurality of groups in order of decreasing service strength, at the end of the available range, before the channel numbers of the channels of programs in the at least one foreign digital data transmission.

7. The method of claim 2, wherein:
  the channel numbers for the channels of programs in the plurality of domestic digital data transmissions other than the particular one of the domestic digital data transmissions that has the strongest service are assigned according to a sorted order, at the end of the available range, before the channel numbers of the channels of programs in the at least one foreign digital data transmission.

8. The method of claim 2, wherein:
  the channel numbers for the channels of programs in the plurality of domestic digital data transmissions other than the particular one of the domestic digital data transmissions that has the strongest service precede the channel numbers for the channels of programs in the at least one foreign digital data transmission, at the end of the available range.

9. The method of claim 1, wherein:
  the receiving at least one foreign digital data transmission, via the receiver, comprises receiving a plurality of foreign digital data transmissions that each include logical channel number data for channels of programs therein;

the assigning channel numbers for the channels of programs in the at least one foreign digital data transmission comprises assigning channel numbers for channels of programs in the plurality of foreign digital data transmissions; and the channel numbers for the channels of programs in the plurality of foreign digital data transmissions are grouped in respective groups, and are assigned in a higher range of the available range of channel numbers of the receiver than the channel numbers for the channels of programs in the at least one domestic digital data transmission.

10. The method of claim 1, wherein:
the channel numbers for the channels of programs in the at least one foreign digital data transmission are assigned according to a sorted order.

11. The method of claim 1, wherein:
the at least one domestic digital data transmission and at least one foreign digital data transmission comprise at least one of audio and video data.

12. The method of claim 1, wherein:
the at least one domestic digital data transmission and at least one foreign digital data transmission are provided in at least one of respective broadcasts, multicasts and streaming content.

13. A method for providing logical channel numbers to channels of programs in multiple digital data transmissions received via a digital transmissions receiver, comprising:

receiving a plurality of domestic digital data transmissions of digital data services with different regional content via the receiver, wherein the plurality of domestic digital data transmissions include logical channel number data for channels of programs therein;

determining a particular one of the plurality of domestic digital data transmissions that has the strongest service via the receiver;

assigning, via the receiver, channel numbers for the channels of programs in the particular one of the domestic digital data transmissions that has the strongest service, according to the logical channel number data therein at a lower range of an available range of channel numbers of the receiver; and assigning, via the receiver, channel numbers, for the channels of programs in the plurality of domestic digital data transmissions other than the particular one of the domestic digital data transmissions that has the strongest service, that are grouped in at least one group, and that are in a higher range of the available range than the channel numbers for identifying the channels of programs in the particular one of the domestic digital data transmissions that has the strongest service, wherein the channel numbers in the higher range are assigned starting at the end of the available range and counting back towards the lower range.

14. The method of claim 13, wherein:
the channel numbers for the channels of programs in the plurality of domestic digital data transmissions other than the particular one of the domestic digital data transmissions that has the strongest service, are assigned according to a sorted order.

15. The method of claim 13, wherein:
the channel numbers for the channels of programs in the plurality of domestic digital data transmissions other than the particular one of the domestic digital data transmissions that has the strongest service, are grouped in a plurality of groups in order of decreasing service strength.

16. The method of claim 13, wherein:
the particular one of the domestic digital data transmissions has the strongest service when its quality alone is highest among the plurality of domestic digital data transmissions; and the particular one of the domestic digital data transmissions has the strongest service when its signal strength alone is highest among at least two of the plurality of domestic digital data transmissions that have the same highest quality.

17. The method of claim 13, wherein:
the particular one of the plurality of domestic digital data transmissions has the strongest service when its frequency is highest among at least two of the plurality of domestic digital data transmissions that have the same highest quality and the same highest signal strength.

18. A non-transitory program storage device embodying a program of instructions executable by a machine to perform a method for providing channel numbers, the method comprising:

receiving at least one domestic digital data transmission and at least one foreign digital data transmission, wherein the at least one domestic digital data transmission and the at least one foreign digital data transmission include logical channel number data for channels of programs therein;

assigning channel numbers for the channels of programs in the at least one domestic digital data transmission according to the logical channel number data therein at a lower range of an available range of channel numbers of the machine; and assigning channel numbers for the channels of programs in the at least one foreign digital data transmission that are in a higher range of the available range than the channel numbers for the channels of programs in the at least one domestic digital data transmission, wherein the channel numbers in the higher range are assigned starting at the end of the available range and counting back towards the lower range.

19. A non-transitory program storage device embodying a program of instructions executable by a machine to perform a method for providing channel numbers, the method comprising:

receiving a plurality of domestic digital data transmissions of digital data services with different regional content, wherein the plurality of domestic digital data transmissions include logical channel number data for channels of programs therein;

determining a particular one of the plurality of domestic digital data transmissions that has the strongest service;

assigning channel numbers for the channels of programs in the particular one of the domestic digital data transmissions that has the strongest service, according to the logical channel number data therein, at a lower range of an available range of channel numbers of the machine; and assigning channel numbers, for the channels of programs in the plurality of domestic digital data transmissions other than the particular one of the domestic digital data transmissions that has the strongest service, that are grouped in at least one group, and that are in a higher range of the available range than the channel numbers for identifying the channels of programs in the particular one of the domestic digital data transmissions that has the strongest service, wherein the channel numbers in the higher range are assigned starting at the end of the available range and counting back towards the lower range.

20. A receiver for providing channel numbers, comprising:
means for receiving at least one domestic digital data transmission and at least one foreign digital data transmission, wherein the at least one domestic digital data transmission and the at least one foreign digital data transmission include logical channel number data for channels of programs therein;
means for assigning channel numbers for the channels of programs in the at least one domestic digital data transmission according to the logical channel number data therein at a lower range of an available range of channel numbers of the receiver; and
means for assigning channel numbers for the channels of programs in the at least one foreign digital data transmission that are in a higher range of the available range than the channel numbers for the channels of programs in the at least one domestic digital data transmission, wherein the channel numbers in the higher range are assigned starting at the end of the available range and counting back towards the lower range.

* * * * *